US008760543B2

(12) United States Patent
McCarten et al.

(10) Patent No.: US 8,760,543 B2
(45) Date of Patent: Jun. 24, 2014

(54) DARK REFERENCE IN CCD IMAGE SENSORS

(75) Inventors: John P. McCarten, Penfield, NY (US); Eric J. Meisenzahl, Ontario, NY (US)

(73) Assignee: Truesense Imaging, Inc., Rochester, NY (US)

( * ) Notice: Subject to any disclaimer, the term of this patent is extended or adjusted under 35 U.S.C. 154(b) by 177 days.

(21) Appl. No.: 13/599,063

(22) Filed: Aug. 30, 2012

(65) Prior Publication Data
US 2013/0076954 A1 Mar. 28, 2013

Related U.S. Application Data

(60) Provisional application No. 61/539,099, filed on Sep. 26, 2011.

(51) Int. Cl.
*H04N 9/64* (2006.01)
*H04N 9/04* (2006.01)

(52) U.S. Cl.
USPC ............ 348/243; 348/249; 348/250; 348/282

(58) Field of Classification Search
CPC ....... H04N 5/357; H04N 5/361; H04N 5/372; H04N 5/3595
USPC .......................... 348/311, 282, 243, 249, 250; 250/208.1, 208.2; 257/222, 225–234; 358/483; 377/57–63
See application file for complete search history.

(56) References Cited

U.S. PATENT DOCUMENTS

| 4,553,169 | A | 11/1985 | Yoshioka et al. |
| 5,519,207 | A | 5/1996 | Morimoto |
| 5,617,461 | A | 4/1997 | Schreiner |
| 5,983,057 | A | 11/1999 | Matsuo et al. |
| 6,366,322 | B1 | 4/2002 | Lee et al. |
| 6,465,821 | B2 | 10/2002 | Yoshida et al. |
| 6,498,622 | B1 | 12/2002 | Nakashiba |
| 6,649,950 | B2 | 11/2003 | He et al. |
| 6,721,005 | B1 * | 4/2004 | Higuchi ........................ 348/243 |
| 6,730,899 | B1 | 5/2004 | Stevens et al. |
| 6,794,215 | B2 | 9/2004 | Park et al. |
| 6,835,590 | B2 | 12/2004 | Lee |
| 6,909,162 | B2 | 6/2005 | Wu et al. |

(Continued)

FOREIGN PATENT DOCUMENTS

| EP | 0273486 B1 | 9/1991 |
| EP | 0568216 B1 | 10/1997 |

(Continued)

OTHER PUBLICATIONS

English language abstract and machine-assisted translation for JP 2011-082386 extracted from the espacenet.com database on Mar. 13, 2014, 26 pages.

(Continued)

*Primary Examiner* — Nhan T Tran
*Assistant Examiner* — Xi Wang
(74) *Attorney, Agent, or Firm* — Howard & Howard Attorneys PLLC

(57) ABSTRACT

In various embodiments, image sensors include an imaging array of optically active pixels, a dark-reference region of optically inactive pixels, and two light shields disposed over the dark-reference region and having openings therein.

11 Claims, 7 Drawing Sheets

(56) References Cited

U.S. PATENT DOCUMENTS

| | | | |
|---|---|---|---|
| 6,995,795 B1 | 2/2006 | Losee et al. | |
| 7,166,878 B2 | 1/2007 | Janesick et al. | |
| 7,364,960 B2 | 4/2008 | Lyu | |
| 7,368,772 B2 | 5/2008 | He et al. | |
| 7,378,691 B2 * | 5/2008 | Geshi et al. | 257/223 |
| 7,397,076 B2 * | 7/2008 | Jang | 257/292 |
| 7,410,823 B2 * | 8/2008 | Shin | 438/60 |
| 7,453,109 B2 | 11/2008 | Koizumi et al. | |
| 7,525,168 B2 | 4/2009 | Hsieh | |
| 7,544,560 B2 | 6/2009 | Noh | |
| 7,576,376 B2 | 8/2009 | Mouli | |
| 7,683,451 B2 * | 3/2010 | Shin | 257/435 |
| 7,713,809 B2 | 5/2010 | Rhoades et al. | |
| 7,737,479 B2 | 6/2010 | Wen et al. | |
| 7,800,147 B2 | 9/2010 | Adkisson et al. | |
| 7,858,914 B2 | 12/2010 | Li et al. | |
| 7,915,067 B2 | 3/2011 | Brady et al. | |
| 7,924,330 B2 | 4/2011 | Xu et al. | |
| 7,989,861 B2 | 8/2011 | Kim et al. | |
| 8,017,984 B2 * | 9/2011 | Kitano et al. | 257/294 |
| 8,072,041 B2 | 12/2011 | Dimitrov | |
| 8,183,603 B2 | 5/2012 | Yamaguchi et al. | |
| 8,184,189 B2 | 5/2012 | Tamura | |
| 8,233,066 B2 | 7/2012 | Zheng et al. | |
| 2005/0133825 A1 | 6/2005 | Rhodes et al. | |
| 2007/0029637 A1 | 2/2007 | Rhodes et al. | |
| 2008/0225140 A1 | 9/2008 | Raynor et al. | |
| 2009/0078974 A1 | 3/2009 | Nagai et al. | |
| 2009/0230488 A1 | 9/2009 | Ando | |
| 2009/0250728 A1 * | 10/2009 | Mizuno et al. | 257/225 |
| 2010/0001178 A1 * | 1/2010 | Koshiba | 250/237 R |
| 2011/0193146 A1 | 8/2011 | Adkisson et al. | |
| 2011/0199518 A1 | 8/2011 | Zheng et al. | |

FOREIGN PATENT DOCUMENTS

| | | |
|---|---|---|
| EP | 0479534 B1 | 12/1997 |
| EP | 1058313 B1 | 12/2006 |
| EP | 1971129 A1 | 9/2008 |
| EP | 2146376 A4 | 4/2012 |
| EP | 2372769 A3 | 6/2012 |
| JP | 2006332124 A | 12/2006 |
| JP | 2011/082386 A | 4/2011 |
| JP | 2011142234 A | 7/2011 |
| WO | WO-2005020333 A3 | 4/2005 |

OTHER PUBLICATIONS

European Search Report for Application No. EP 09757067 dated Feb. 5, 2014, 2 pages.

* cited by examiner

DARK REFERENCE IN CCD IMAGE SENSORS

RELATED APPLICATION

This application claims the benefit of and priority to U.S. Provisional Patent Application No. 61/539,099, filed Sep. 26, 2011, the entire disclosure of which is hereby incorporated herein by reference.

TECHNICAL FIELD

The present invention relates, in various embodiments, to the construction, fabrication, and use of charge-coupled-device (CCD) image sensors.

BACKGROUND

Charge-coupled device (CCD) image sensors typically include an array of photosensitive areas that collect charge carriers in response to illumination. The collected charge is subsequently transferred from the array of photosensitive areas and converted to a voltage from which an image may be reconstructed by associated circuitry. FIG. 1 depicts a conventional interline CCD image sensor 100 that contains an array of photosensitive areas 110 (each of which may include or consist essentially of a photodiode, photodetector, photocapacitor, or photoconductor) arranged in columns. A vertical CCD (VCCD) 120 is disposed next to each column of photosensitive areas 110, and the VCCDs 120 are connected to a horizontal CCD (HCCD) 130.

As shown schematically in FIG. 1 (for only one column of photosensitive areas 110, for clarity), following an exposure period, charge is transferred from the photosensitive areas 110 into the VCCDs 120, which subsequently shift the charge, row-by-row in parallel, into the HCCD 130. The HCCD then transfers the pixel charge serially to output circuitry, e.g., an output charge-sensing amplifier 140. The resulting data is then typically digitized, and the digitized image is displayed on a display or stored in a storage unit.

In order to obtain proper image contrast, brightness, and color levels, a signal reference is selected in order to properly calibrate the black level of the digitized image. In principle, extra horizontal clock cycles could be added to the timing sequence and utilized to produce the black reference; however, such techniques may not be advisable because, regardless of light level, both the photosensitive areas 110 and VCCDs 120 generate a thermal signal, known as dark current, that acts to brighten the apparent "darkness" of black levels in these regions. Since the mere use of additional HCCD cycles does not correct for dark currents in the photosensitive areas 110 and VCCDs 120, black regions in the image will appear gray due to this improper calibration level (or improper "black clamp").

FIG. 2 depicts a common technique for correcting the black level for dark currents (or "dark signal") for an interline CCD image sensor. As shown, an interline CCD image sensor 200 includes a light-sensitive image array 210 surrounded by regions 220, 230, 240, 250 of dark reference pixels. The light-sensitive image array 210 includes optically active pixels utilized to acquire images as detailed above. Charge from the optically active pixels and the dark reference pixels in regions 220, 230, 240, 250 is transferred into an HCCD 260, and the charge corresponding to each row is read out to a charge-sensing amplifier 270.

As indicated by the shading on FIG. 2, a metal light shield is typically used to prevent light from entering the dark reference pixel regions 220, 230, 240, 250. Typical materials for the light shield include aluminum, copper, tungsten, or TiW. In principle, only one of the four regions 220, 230, 240, 250 is necessary to provide a black clamp. In practice, however, regions 240, 250 are most often used as the black-level reference, and the black level is set on a row-by-row basis to minimize row noise in the system electronics.

In theory the dark signal from the regions of dark reference pixels 240, 250 should be the same as from the light-sensitive image array 210. However, in practice the dark signal may vary substantially between the two regions. For example, often a solid metal sheet will be utilized to block incoming light in dark reference regions 240, 250. In such situations, black regions in the image area will appear blacker than the black level set according to regions 240, 250 if, for reasons explained below, the dark signal in the dark reference regions 240, 250 exceeds the dark signal from the image array 210. This difference in dark signal between the image area and dark reference region is generally referred to as a "dark step," and results in an improper black clamp.

FIGS. 3A and 3B illustrate the origin of the dark step. FIG. 3A depicts a typical cross-section through image sensor 100 along the line A-A' in the optically active region, and FIG. 3B depicts a similar cross-section within the dark reference region of the image sensor (e.g., within region 240 or 250 of image sensor 200). As shown, the image sensor is typically fabricated utilizing a semiconductor structure 300. Semiconductor structure 300 typically includes an n-type substrate 305 (e.g., a silicon substrate), a p-type well 310 that acts as a vertical overflow drain (as known in the art), an n-type photodetector 315 in which charge (i.e., "photocharge") induced by incident light accumulates, and a p-type pinning layer 320 that reduces photodetector dark current. The image sensor also includes an n-type VCCD 325 and, surrounding the VCCD 325, a p-type transfer gate region 330 and two p-type channel stop regions 335, 340.

Above the semiconductor structure are thin dielectric layers 345, 350, which typically include or consist essentially of $SiO_2$, $HfO_2$, or $SiO_2/Si_3N_4/SiO_2$. For some CCD image sensors, the dielectric layer 345 over the photodetector 315 and the dielectric layer 350 over the VCCD 325 are portions of the same layer, but in other devices they are different and distinct layers. The image sensor also includes a gate 355 that is typically formed of polysilicon, indium tin oxide (ITO), or metal. Application of a large voltage to the gate 355 transfers an amount of photocharge (or a "charge packet") from the photodetector 315 to the VCCD 325. The multiple gates over the VCCD register 120 (as shown in FIG. 1) are then clocked sequentially to move multiple charge packets row-by-row into the HCCD 130. As described in U.S. Pat. No. 5,250,825, the entire disclosure of which is incorporated by reference herein, a metal light shield 360 covers the VCCD 325. The light shield 360 prevents entry of light into the VCCD 325, as such light generates undesired extra charge carriers during the time necessary to read out the image from the VCCD 325. The light shield 360 is typically electrically isolated from the transfer gate 355 by dielectric layers 365, 370, and covers only the VCCDs 325, so as not to prevent entry of light into photodetectors 315 during image acquisition.

A major source of dark current in VCCD 325 is unterminated silicon bonds at the silicon/dielectric interface above the VCCD 325. Typically a sintering step (e.g., an anneal in a hydrogen ambient) is included late in the manufacturing process in order to passivate such unterminated atomic bonds. A typical sinter step may be performed in the 350° C. to 500° C. range for 30 minutes to 2 hours. Hydrogen in the sinter environment (or from sources within the device itself) diffuses throughout the device during the sinter process. Hydrogen reaching the silicon/dielectric interface is often captured by the unterminated bonds, thus passivating the silicon surface and reducing the VCCD dark current dramatically.

As shown in FIG. 3B, in the dark reference region 240, 250, a light shield 375 is typically a solid metal sheet that covers not only VCCDs 325 but also photodetectors 315 in order to prevent incoming light from affecting the measured dark signal. However, the diffusion of hydrogen is blocked by most metals. Thus, in order to reach the silicon/dielectric interface in the dark reference regions 240, 250, hydrogen must first diffuse around (rather than through) the dark reference light shield 375. As a result, less hydrogen reaches the silicon/dielectric interface, fewer unterminated bonds are passivated in dark reference regions 240, 250, and the deleterious dark step occurs. Thus, there is a need for CCD image sensor designs enabling passivation of unterminated bonds in the dark reference region while preventing light from impinging thereon, thereby enabling improved calibration of dark levels in images acquired by the sensor.

SUMMARY

Embodiments of the present invention protect dark reference regions from stray light yet also enable passivation of dangling (i.e., unterminated) bonds at the semiconductor/dielectric interface in order to minimize or eliminate dark-current generation at the interface. In general, multiple stacked light shields are utilized above the photosensitive areas (e.g., photodetectors, photodiodes, photocapacitors, or photoconductors; herein, references to photodetectors are shorthand for any of these different types of photosensitive areas) and VCCDs within the region(s) of dark reference pixels, and openings are provided within the light shields, thus forming shorter paths for the diffusion of hydrogen for the passivation of unterminated interatomic bonds. These openings are generally formed over either the photosensitive areas or the VCCDs but not both, and, above each particular photosensitive area or VCCD, there is an opening in only one of the light shields. Such "staggering" of the openings over spatially separated devices substantially eliminates paths along which stray light may enter the device and deleteriously impact the dark reference level of the image sensor. Furthermore, the "photosensitive" areas in the dark-reference area may lack the actual p-n (or p-i-n) junction utilized to generate photocharge in the photosensitive areas of the active image-sensing area. Thus, as applied to one or more of the pixels of the dark reference area, "photosensitive areas" may refer to regions disposed between VCCD regions and that may otherwise resemble photosensitive areas of the image-sensing area, but that lack one or more regions of dopants utilized to define the photodetector therewithin.

Furthermore, in various embodiments of the invention, the active image-sensing area of the image sensor also features the two light shields, both of which have openings therewithin over the photosensitive areas of the active pixels and typically do not have openings over the VCCDs. This arrangement allows the maximum amount of light to impinge upon the photosensitive areas of the imaging array during image acquisition while substantially preventing light-leakage-induced signals within the VCCDs utilized to transfer photocharge for read out.

In an aspect, embodiments of the invention feature an image sensor including or consisting essentially of an imaging array of optically active pixels, a dark-reference region of optically inactive pixels proximate the imaging array, and first and second substantially opaque light shields. Each optically active pixel includes or consists essentially of a photosensitive area and a VCCD region associated therewith. Each optically inactive pixel includes or consists essentially of a photosensitive area and a VCCD region associated therewith. The first light shield is disposed over the dark-reference region of optically inactive pixels and defines a plurality of openings therein. The second light shield defines a plurality of openings therein and is disposed over the first light shield. Within the dark-reference region, the openings in the first light shield are disposed over photosensitive areas or VCCD regions but not both. If the openings in the first light shield are disposed over photosensitive areas, then the openings in the second light shield are disposed over photosensitive areas but not VCCD regions, such that each photosensitive area in the dark-reference region has no more than one opening (i.e., collectively between the first and second light shields) thereover. If the openings in the first light shield are disposed over VCCD regions, then the openings in the second light shield are disposed over VCCD regions but not photosensitive areas, such that each VCCD region in the dark-reference region has no more than one opening (i.e., collectively between the first and second light shields) thereover.

Embodiments of the invention feature one or more of the following in any of a variety of combinations. A first dielectric layer may be disposed between the first and second light shields. A second dielectric layer may be disposed above the second light shield. The openings in the first light shield may be disposed over photosensitive areas, and, along a row of pixels in the dark-reference region, photosensitive areas over which the first light shield has an opening may be separated by at least one photosensitive area (a) over which the first light shield does not have an opening and (b) over which the second light shield has an opening. The row of pixels in the dark-reference region may include photosensitive areas over which the first light shield has an opening alternating with photosensitive areas over which the second light shield has an opening. The openings in the first light shield may be disposed over photosensitive areas, and there may be no openings in the first and second light shields disposed over the VCCD regions in the dark-reference region. The openings in the first light shield may be disposed over VCCD regions, and, along a row of pixels in the dark-reference region, VCCD regions over which the first light shield has an opening may be separated by at least one VCCD region (a) over which the first light shield does not have an opening and (b) over which the second light shield has an opening. The row of pixels in the dark-reference region may include VCCD regions over which the first light shield has an opening alternating with VCCD regions over which the second light shield has an opening. The openings in the first light shield may be disposed over VCCD regions, and there may be no openings in the first and second light shields disposed over the photosensitive areas in the dark-reference region. Each photosensitive area in the imaging array of optically active pixels may include or consist essentially of a light-sensitive device selected from the group consisting of a photodetector, a photodiode, a photocapacitor, and a photoconductor. One or more (or even all) of the photosensitive areas in the dark-reference region of optically inactive pixels may lack at least one region of dopants that at least partially defines the light-sensitive device in each photosensitive area in the imaging array of optically active pixels.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean ±10%, and in some embodiments, ±5%. The term "consists essentially of" means excluding other materials that contribute to function, unless otherwise defined herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
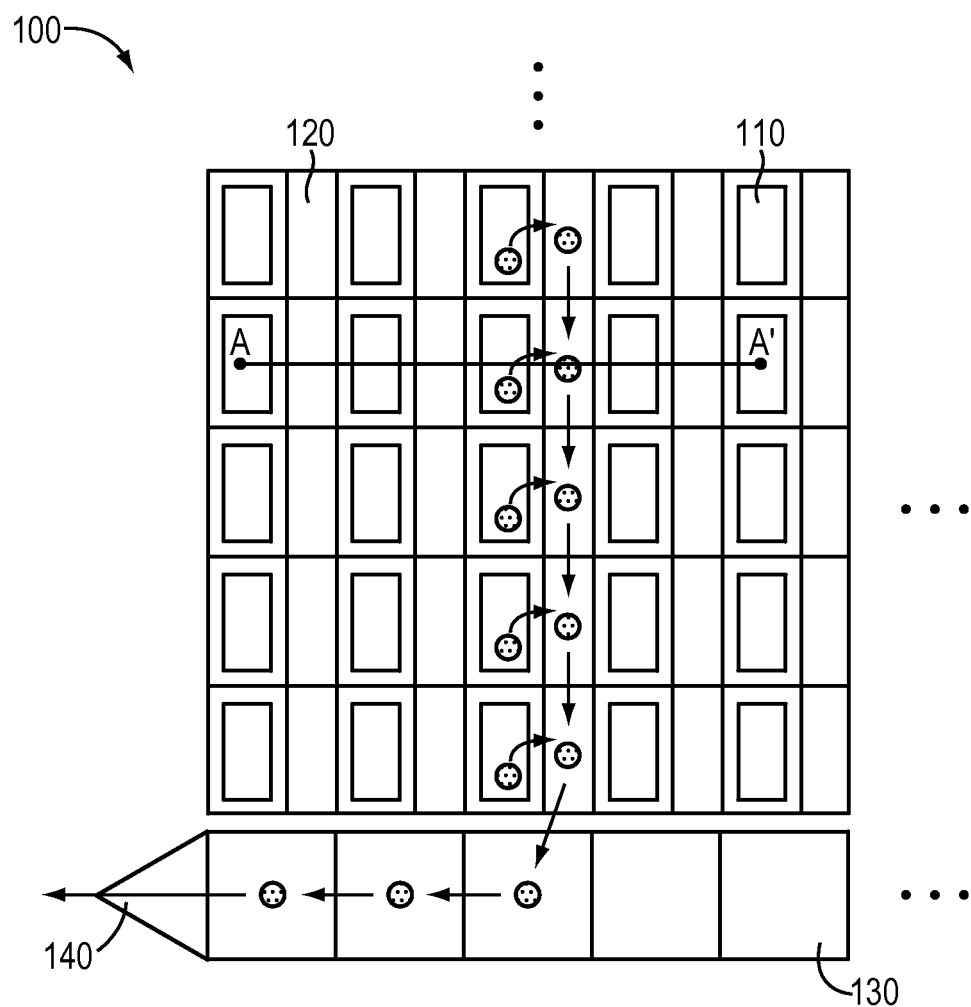
FIG. 1 is a block diagram of a conventional CCD image sensor.
Figure 2:
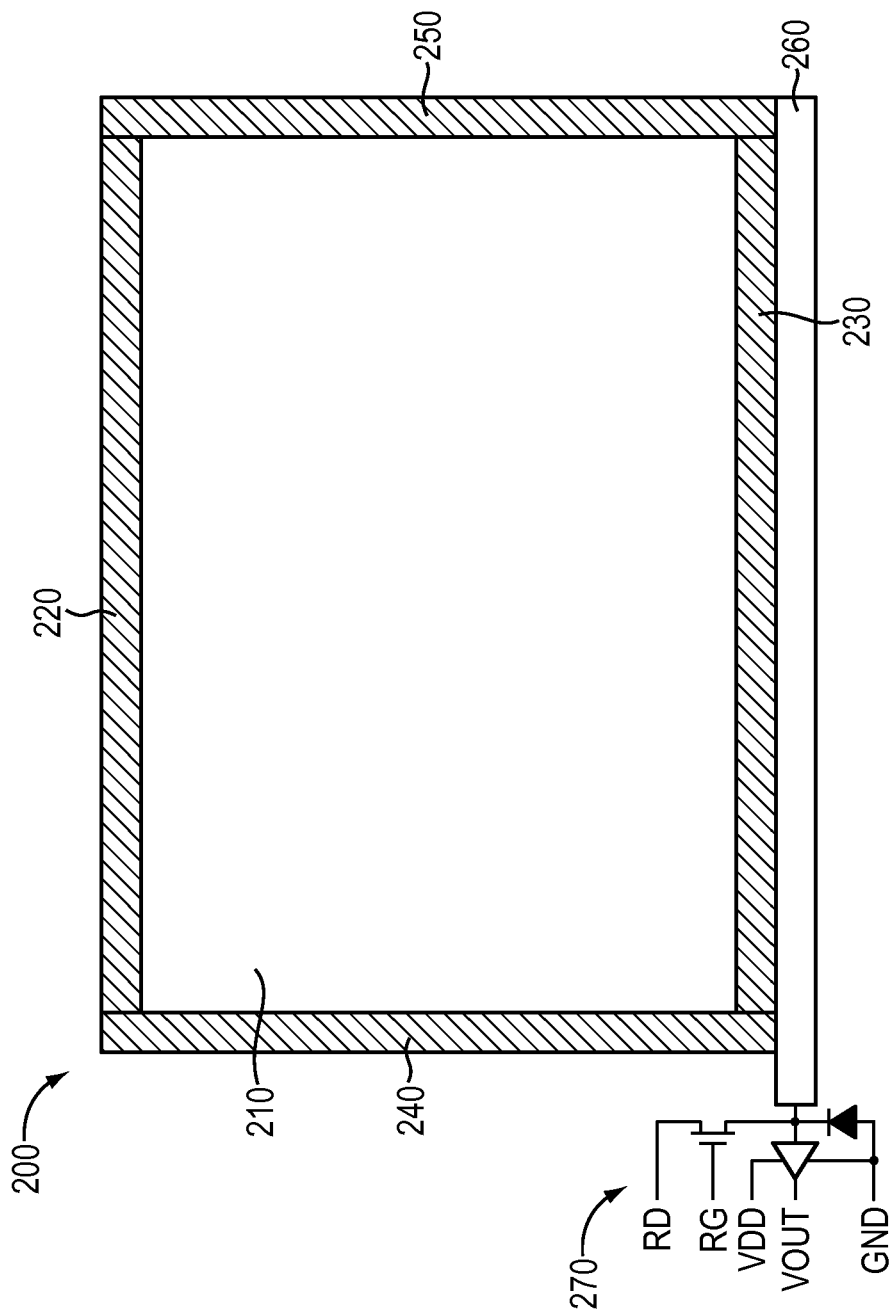
FIG. 2 is a schematic plan view of a conventional CCD image sensor with active photosensitive and dark reference regions.
Figure 3A:
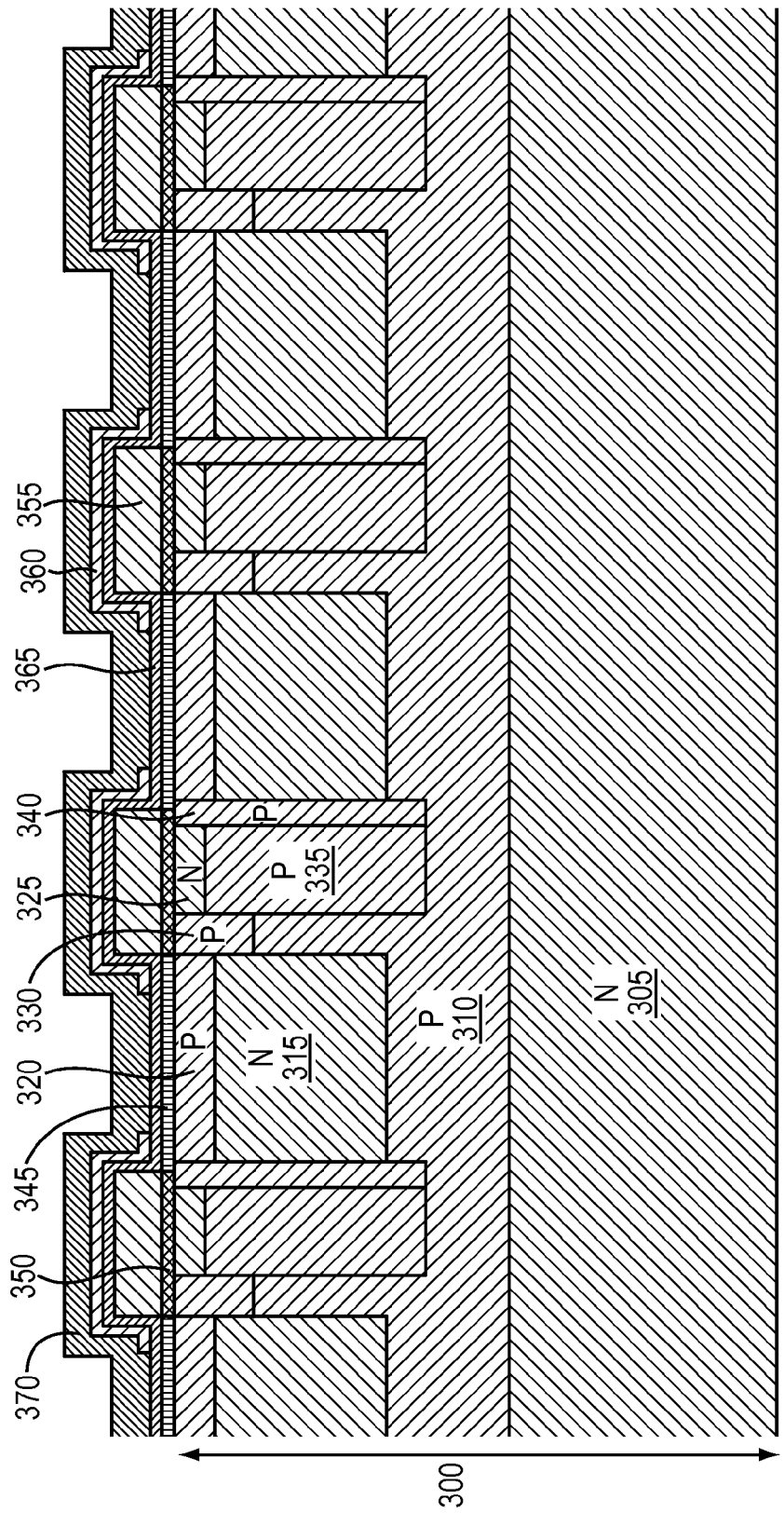
FIG. 3A is a schematic cross-section of a conventional CCD image sensor within an active photosensitive region thereof.
Figure 3B:
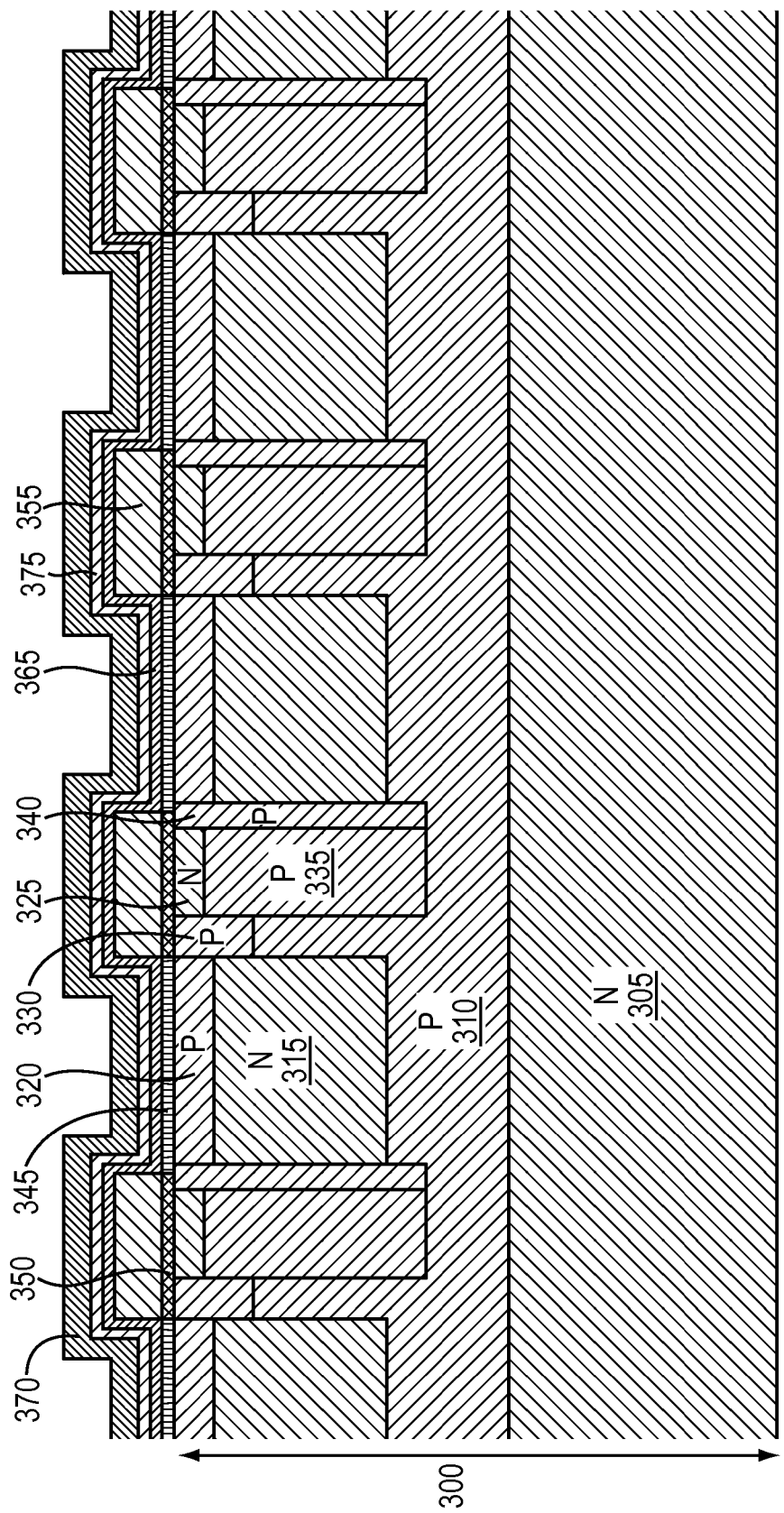
FIG. 3B is a schematic cross-section of a conventional CCD image sensor within a dark reference region thereof.
Figure 4:
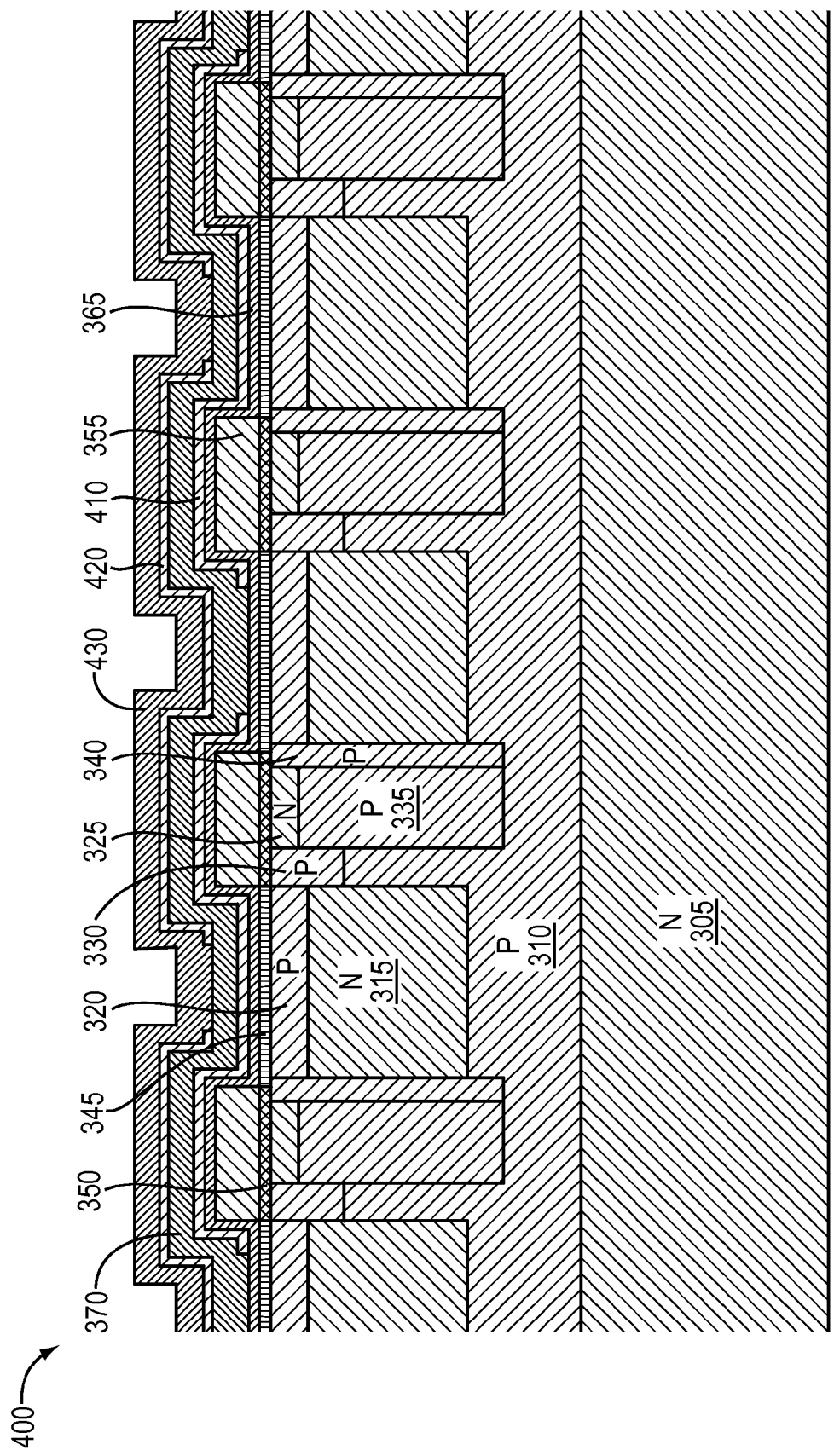
FIGS. 4 and 5 are schematic cross-sections of portions of dark reference regions of CCD image sensors in accordance with various embodiments of the invention.

FIG. 4 schematically depicts a cross-section of four pixels within a dark reference region 400 in accordance with embodiments of the present invention. The region 400 incorporates two different light shields 410, 420, each of which may include or consist essentially of one or more metals or other opaque materials (e.g., aluminum, copper, tungsten, or TiW). As shown, the first light shield 410 and the second light shield 420 each have openings therewithin in order to enable the diffusion of hydrogen therethrough during sintering, thereby enabling passivation of dangling bonds. In a preferred embodiment, an opening in first light shield 410 or an opening in second light shield 420 is disposed above a particular photodetector 315, and no openings in either light shield 410, 420 are disposed over each of the VCCDs 325. This geometry of the openings in the light shields 410, 420 enables sufficient hydrogen diffusion from the ambient (during sintering), because the openings in light shield 410 are generally separated from the openings in light shield 420 only by the width of a VCCD 325 therebetween. This separation between the openings in light shields 410, 420 also provides sufficient overlap between light shields 410, 420 to substantially prevent stray light from impinging upon the photodetectors 315, thereby enabling determination of the black level within the image sensor substantially unaffected by either stray light or spurious dark currents due to dangling bonds.

Furthermore, because both light shields 410, 420 cover each VCCD 325 for all columns of dark reference pixels, corruption of the dark reference due to "smear" signal is greatly reduced or substantially eliminated. In general, a single light shield 410, 420 typically attenuates the intensity of light passing therethrough (to the VCCD) by 4 to 5 orders of magnitude; thus, embodiments of the invention utilizing both light shields 410, 420 without openings therein (over the VCCDs) will typically attenuate intensity of light passing therethrough by 8 to 10 orders of magnitude. As shown, an additional dielectric layer 430 may be disposed over light shields 410, 420 for electrical isolation.

Figure 5:
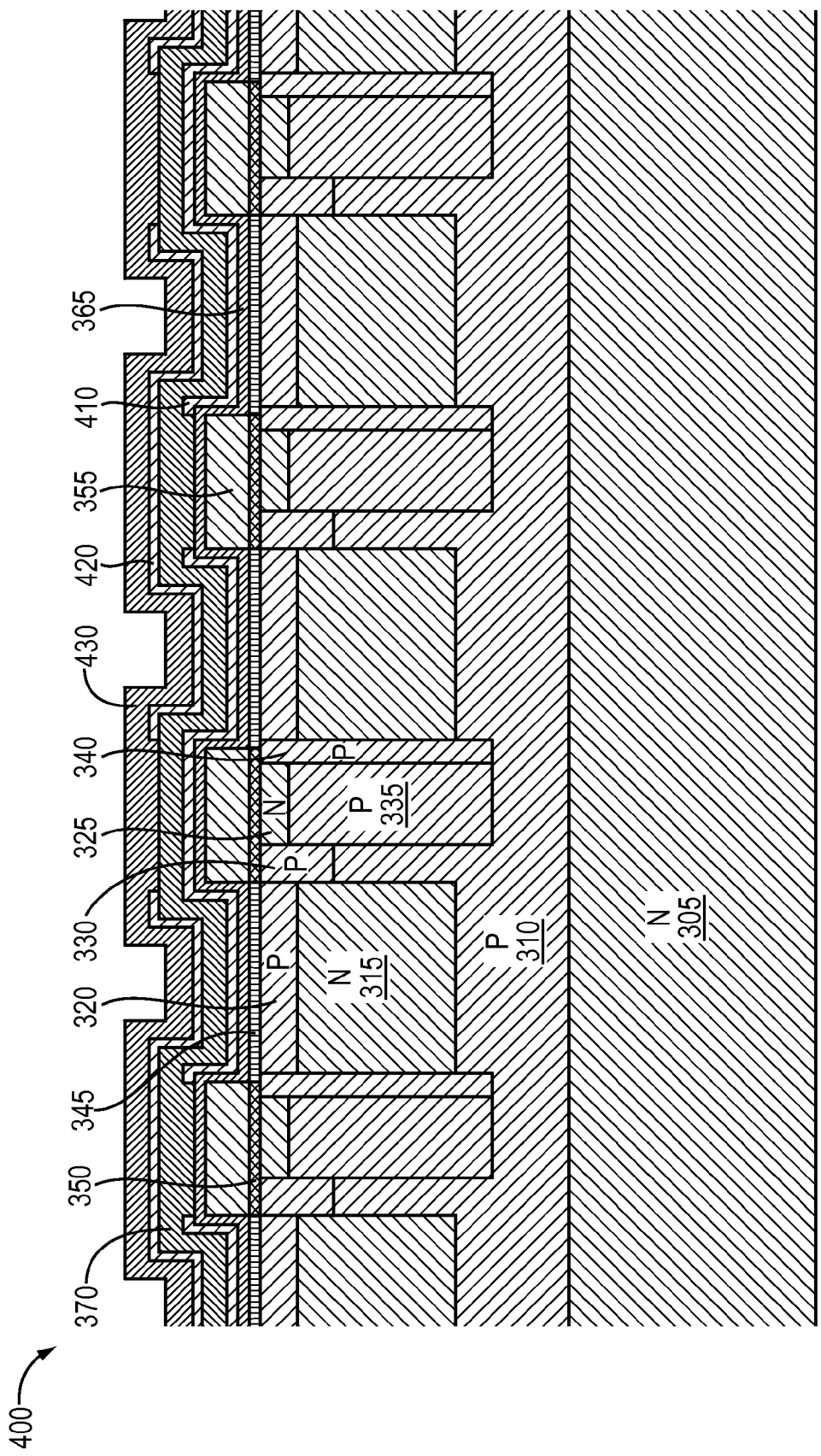

FIG. 5 depicts another embodiment of the present invention in which an opening in first light shield 410 or an opening in second light shield 420 is disposed above a particular VCCD 325, and no openings in either light shield 410, 420 are disposed over each of the photodetectors 315. This geometry of the openings in the light shields 410, 420 enables sufficient hydrogen diffusion from the ambient (during sintering), because the openings in light shield 410 are generally separated from the openings in light shield 420 only by the width of a photodetector 315 therebetween. This separation between the openings in light shields 410, 420 also provides sufficient overlap between light shields 410, 420 to substantially prevent stray light from impinging upon the photodetectors 315, thereby enabling determination of the black level within the image sensor substantially unaffected by either stray light or spurious dark currents due to dangling bonds. Compared to the embodiment depicted in FIG. 4, increased smear signal may be generated within the VCCDs 325 (due to the opening in light shield 410 or the opening in light shield 420 thereover) but the intensity of light transmitted to the photodetectors 315 is significantly attenuated (e.g., by 8 to 10 orders of magnitude, as detailed above). In both illustrated embodiments, dark signal due to unpassivated bonds is reduced or substantially minimized via the introduction of "diffusion paths" through the staggered openings in the light shields 410, 420.

Various embodiments of the invention reduce the amount of photocharge reaching one or more of the VCCDs 325 in the dark-reference region by altering the fabrication process for one or more of the photosensitive areas in the dark-reference region. Specifically, embodiments of the invention omit the dopant-introduction (e.g., ion implantation) steps utilized to form one or more of the photodetectors 315 in the dark-reference region, as described in U.S. Pat. No. 6,903,768, filed Jul. 8, 1999, the entire disclosure of which is incorporated by reference herein. (The dopant-introduction step(s) are still utilized to fabricate photodetectors 315 in the optically active imaging region.) In this manner, the dopants utilized to form the photocharge-generating p-n (or p-i-n) junction in one or more of the photosensitive areas in the dark-reference region are omitted; thus, even should light reach such areas, little or no photocharge will result and be transferred to neighboring VCCDs 325, and light-generated signal reaching the VCCDs in the dark-reference region may be decreased by as much as 5 orders of magnitude, by up to 9-10 orders of magnitude, or even more.

Figure 6:
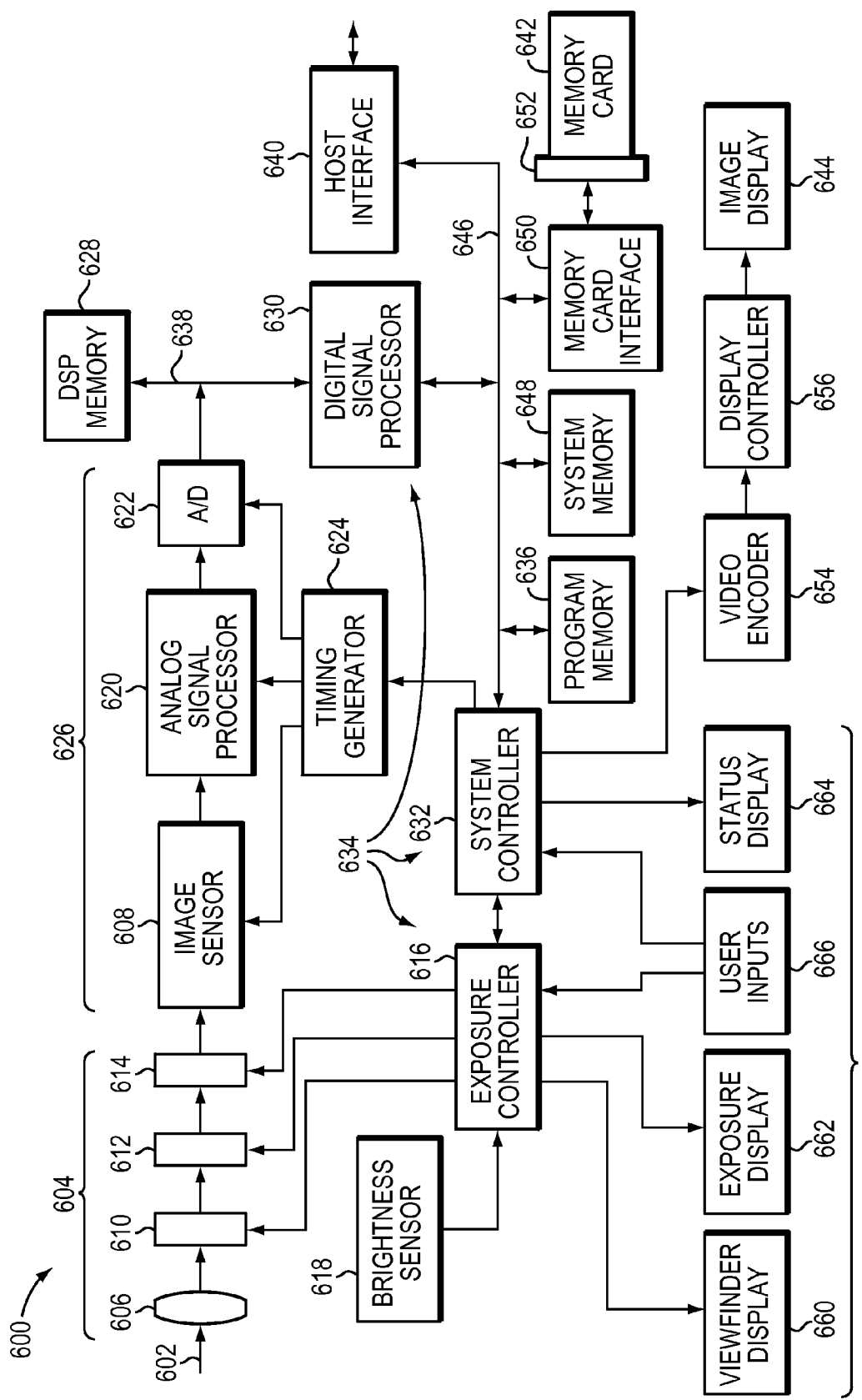
FIG. 6 is a block diagram of an image capture device incorporating a CCD image sensor in accordance with various embodiments of the invention.

Embodiments of the present invention may be utilized in a variety of different systems and devices, including, for example, digital cameras, digital video cameras, scanners, and telescopes. FIG. 6 illustrates an exemplary image capture device 600 in accordance with an embodiment of the invention. Image capture device 600 is implemented as a digital camera in FIG. 6.

Light 602 from a subject scene to be imaged is input to an imaging stage 604, where the light is focused by a lens 606 to form an image on a CCD image sensor 608 (which may features depicted in FIG. 4 and/or FIG. 5). Image sensor 608 converts the incident light to an electrical signal for each pixel thereof. The pixels of image sensor 608 may have a color filter array (not shown) applied thereover so that each pixel senses a portion of the imaging spectrum, as is known in the art.

The light passes through the lens 606 and a filter 610 prior to being sensed by image sensor 608. Optionally, light 602 passes through a controllable iris 612 and a mechanical shutter 614. The filter 610 may include or consist essentially of an optional neutral-density filter for imaging brightly lit scenes. An exposure controller 616 responds to the amount of light available in the scene, as metered by a brightness sensor block 618, and regulates the operation of filter 610, iris 612, shutter 614, and the integration time (or exposure time) of image sensor 608 to control the brightness of the image as sensed by image sensor 608.

This description of a particular camera configuration will be familiar to those skilled in the art, and it will be obvious that many variations and additional features are, or may be, present. For example, an autofocus system may be added, or the lenses may be detachable and interchangeable. It will be understood that embodiments of the present invention may be applied to any type of digital camera, where similar functionality is provided by alternative components. For example, the digital camera may be a relatively simple point-and-shoot digital camera, where shutter 614 is a relatively simple movable blade shutter, or the like, instead of a more complicated focal plane arrangement as may be found in a digital single-lens reflex camera. Embodiments of the invention may also be incorporated within imaging components included in simple camera devices such as those found in, e.g., mobile phones and automotive vehicles, which may be operated without controllable irises 612 and/or mechanical shutters 614. Lens 606 may be a fixed focal-length lens or a zoom lens.

As shown, the analog signal from image sensor 608 (corresponding to the amount of charge collected from one or more pixels) is processed by analog signal processor 620 and applied to one or more analog-to-digital (A/D) converters 622. A timing generator 624 produces various clocking signals to select rows, columns, or pixels in image sensor 608, to transfer charge out of image sensor 608, and to synchronize the operations of analog signal processor 620 and A/D converter 622. An image sensor stage 626 may include image sensor 608, analog signal processor 620, A/D converter 622, and timing generator 624. The resulting stream of digital pixel values from A/D converter 622 is stored in a memory 628 associated with a digital signal processor (DSP) 630.

DSP 630 is one of three processors or controllers in the illustrated embodiment, which also includes a system controller 632 and exposure controller 616. Although this partitioning of camera functional control among multiple controllers and processors is typical, these controllers or processors are combined in various ways without affecting the functional operation of the camera and the application of embodiments of the present invention. These controllers or processors may include or consist essentially of one or more DSP devices, microcontrollers, programmable logic devices, or other digital logic circuits. Although a combination of such controllers or processors has been described, it should be apparent that one controller or processor may be designated to perform all of the required functions. All of these variations may perform the same function and fall within the scope of various embodiments of the invention, and the term "processing stage" is utilized herein to encompass all of this functionality within one phrase, for example, as in processing stage 634 in FIG. 6.

In the illustrated embodiment, DSP 630 manipulates the digital image data in memory 628 according to a software program stored in a program memory 636 and copied to memory 628 for execution during image capture. DSP 630 executes the software necessary for image processing in an embodiment of the invention. Memory 628 may include or consist essentially of any type of random access memory, such as SDRAM. A bus 638, a pathway for address and data signals, connects DSP 630 to its related memory 628, A/D converter 622, and other related devices.

System controller 632 controls the overall operation of the image capture device 600 based on a software program stored in program memory 636, which may include or consist essentially of, e.g., flash EEPROM or other nonvolatile memory. This memory may also be used to store image sensor calibration data, user setting selections, and/or other data to be preserved when the image capture device 600 is powered down. System controller 632 controls the sequence of image capture by directing exposure controller 616 to operate lens 606, filter 610, iris 612, and shutter 614 as previously described, directing timing generator 624 to operate image sensor 608 and associated elements, and directing DSP 630 to process the captured image data. After an image is captured and processed, the final image file stored in memory 628 may be transferred to a host computer via an interface 640, stored on a removable memory card 642 or other storage device, and/or displayed for the user on an image display 644.

A bus 646 includes a pathway for address, data and control signals, and connects system controller 632 to DSP 630, program memory 636, a system memory 648, host interface 640, memory card interface 650, and/or other related devices. Host interface 640 provides a high-speed connection to a personal computer or other host computer for transfer of image data for display, storage, manipulation, and/or printing. This interface may include or consist essentially of an IEEE 1394 or USB 2.0 serial interface or any other suitable digital interface. Memory card 642 is typically a Compact Flash card inserted into a socket 652 and connected to system controller 632 via memory card interface 650. Other types of storage that may be utilized include, without limitation, PC-Cards, MultiMedia Cards, and/or Secure Digital cards.

Processed images may be copied to a display buffer in system memory 648 and continuously read out via a video encoder 654 to produce a video signal. This signal may be output directly from image capture device 600 for display on an external monitor, or processed by a display controller 656 and presented on image display 644. This display is typically an active-matrix color liquid crystal display, although other types of displays may be utilized.

A user interface 658, including all or any combination of a viewfinder display 660, an exposure display 662, a status display 664, image display 644, and user inputs 666, may be controlled by one or more software programs executed on exposure controller 616 and system controller 632. User inputs 666 typically include some combination of buttons, rocker switches, joysticks, rotary dials, and/or touch screens. Exposure controller 616 operates light metering, exposure mode, autofocus and other exposure functions. System controller 632 manages the graphical user interface (GUI) presented on one or more of the displays, e.g., on image display 644. The GUI typically includes menus for making various option selections and review modes for examining captured images.

Exposure controller 616 may accept user inputs selecting exposure mode, lens aperture, exposure time (shutter speed), and exposure index or ISO speed rating and directs the lens and shutter accordingly for subsequent captures. Optional brightness sensor 618 may be employed to measure the brightness of the scene and provide an exposure meter function for the user to refer to when manually setting the ISO speed rating, aperture, and shutter speed. In this case, as the user changes one or more settings, the light meter indicator presented on viewfinder display 660 tells the user to what degree the image will be over- or under-exposed. In an alternate case, brightness information is obtained from images captured in a preview stream for display on image display 644. In an automatic exposure mode, the user changes one setting and exposure controller 616 automatically alters another setting to maintain correct exposure, e.g., for a given ISO speed rating when the user reduces the lens aperture, exposure controller 616 automatically increases the exposure time to maintain the same overall exposure.

The foregoing description of an image capture device will be familiar to one skilled in the art. It will be obvious that there are many variations that are possible and may be selected to reduce the cost, add features, or improve the performance thereof.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An image sensor comprising:
   an imaging array of optically active pixels each comprising (i) a photosensitive area and (ii) a vertical CCD (VCCD) region associated therewith;
   proximate the imaging array, a dark-reference region of optically inactive pixels each comprising (i) a photosensitive area and (ii) a VCCD region associated therewith;
   a first substantially opaque light shield (i) disposed over the dark-reference region of optically inactive pixels and (ii) defining a plurality of openings therein; and
   a second substantially opaque light shield (i) defining a plurality of openings therein and (ii) disposed over the first light shield,
   wherein:
   within the dark-reference region, the openings in the first light shield are disposed over photosensitive areas or VCCD regions but not both,
   if the openings in the first light shield are disposed over photosensitive areas, then the openings in the second light shield are disposed over photosensitive areas but not VCCD regions, such that each photosensitive area in the dark-reference region has no more than one opening thereover, and
   if the openings in the first light shield are disposed over VCCD regions, then the openings in the second light shield are disposed over VCCD regions but not photosensitive areas, such that each VCCD region in the dark-reference region has no more than one opening thereover.

2. The image sensor of claim 1, further comprising a first dielectric layer disposed between the first and second light shields.

3. The image sensor of claim 2, further comprising a second dielectric layer disposed above the second light shield.

4. The image sensor of claim 1, wherein (i) the openings in the first light shield are disposed over photosensitive areas and (ii) along a row of pixels in the dark-reference region, photosensitive areas over which the first light shield has an opening are separated by at least one photosensitive area (a) over which the first light shield does not have an opening and (b) over which the second light shield has an opening.

5. The image sensor of claim 4, wherein the row of pixels in the dark-reference region comprises photosensitive areas over which the first light shield has an opening alternating with photosensitive areas over which the second light shield has an opening.

6. The image sensor of claim 1, wherein (i) the openings in the first light shield are disposed over photosensitive areas and (ii) there are no openings in the first and second light shields disposed over the VCCD regions in the dark-reference region.

7. The image sensor of claim 1, wherein (i) the openings in the first light shield are disposed over VCCD regions and (ii) along a row of pixels in the dark-reference region, VCCD regions over which the first light shield has an opening are separated by at least one VCCD region (a) over which the first light shield does not have an opening and (b) over which the second light shield has an opening.

8. The image sensor of claim 7, wherein the row of pixels in the dark-reference region comprises VCCD regions over which the first light shield has an opening alternating with VCCD regions over which the second light shield has an opening.

9. The image sensor of claim 1, wherein (i) the openings in the first light shield are disposed over VCCD regions and (ii) there are no openings in the first and second light shields disposed over the photosensitive areas in the dark-reference region.

10. The image sensor of claim 1, wherein each photosensitive area in the imaging array of optically active pixels comprises a light-sensitive device selected from the group consisting of a photodetector, a photodiode, a photocapacitor, and a photoconductor.

11. The image sensor of claim 10, wherein one or more of the photosensitive areas in the dark-reference region of optically inactive pixels lack at least one region of dopants that at least partially defines the light-sensitive device in each photosensitive area in the imaging array of optically active pixels.

* * * * *